United States Patent
Okuda

(10) Patent No.: US 6,509,598 B2
(45) Date of Patent: Jan. 21, 2003

(54) SEMICONDUCTOR MEMORY DEVICE HAVING A REDUNDANT BLOCK AND REDUCED POWER CONSUMPTION

(75) Inventor: Tomio Okuda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/767,303

(22) Filed: Jan. 23, 2001

(65) Prior Publication Data

US 2002/0027811 A1 Mar. 7, 2002

(30) Foreign Application Priority Data

Jan. 24, 2000 (JP) ...................................... 2000-015018

(51) Int. Cl.[7] ................................................ G11C 7/00
(52) U.S. Cl. ....................... 257/300; 257/297; 365/200; 365/222
(58) Field of Search .................. 257/297–312; 265/200, 222

(56) References Cited

U.S. PATENT DOCUMENTS 6,122,206 A * 9/2000 Fujita ......................... 365/200

FOREIGN PATENT DOCUMENTS

| JP | 63-217600 | 9/1988 |
|---|---|---|
| JP | 2-161698 | 6/1990 |
| JP | 11-168143 | 6/1999 |

* cited by examiner

*Primary Examiner*—Fetsum Abraham
(74) *Attorney, Agent, or Firm*—Katten, Muchin, Zavis, Rosenman

(57) ABSTRACT

A redundant circuit of the semiconductor memory device is composed of a fuse block which assigns addresses of defective memory cells by selectively disconnecting fuses of the fuse block, address latches which individually generate and hold fuse information depending on whether the fuses are supplied with currents or not at the time of initialization, a redundant circuit-selecting latch which generates and holds fuse information depending on whether a redundant circuit-selecting fuse is supplied with a current or not and outputs a terminal voltage of the redundant circuit-selecting fuse at the time of initialization, and a N-type MOS transistor which forms returning paths of the currents flowing through the fuses of the fuse block in accordance with the terminal voltage of the redundant circuit-selecting fuse.

11 Claims, 5 Drawing Sheets

SEMICONDUCTOR MEMORY DEVICE HAVING A REDUNDANT BLOCK AND REDUCED POWER CONSUMPTION

FIELD OF THE INVENTION

The invention relates to a semiconductor memory device, and especially to a semiconductor memory device in which a defective memory cell is replaced with a redundant memory cell array when a defective part occurs in a main memory and information on an address of a defective memory cell is generated by selectively disconnecting fuses.

BACKGROUND OF THE INVENTION

In a semiconductor memory device, it sometimes occurs that a memory cell array does not operate because it is used exceeding a margin determined at the time of designing or fabrication, or fabricated imperfectly. If there is a part which does not operate as mentioned in the above, the whole semiconductor memory device may be regarded as inferior goods.

Hitherto, a defective memory cell array is replaced with a redundant memory cell array prepared previously on the basis of information on an address of the defective memory cell which is obtained in a test performed before the semiconductor memory is packaged. When the defective memory cell array is replaced with the redundant memory array, information on the address of the defective memory cell is generated by selectively disconnecting fuses. In case that the defective memory cell array is replaced with the redundant memory cell array, the address of the defective memory cell is assigned to that of the redundant memory cell array on the basis of information on the address of the defective memory cell. Accordingly, when an address signal corresponding to the defective memory cell is inputted, the memory cell of the redundant memory cell array is selected, and the semiconductor memory device is kept to be used as an excellent article though there is a defective part therein.

FIG. 1 shows a conventional semiconductor memory device. Although a single redundant circuit is shown in FIG. 1, the number of the redundant circuits is the same as that of the redundant memory cell arrays in the actual semiconductor memory device.

The semiconductor memory device shown in FIG. 1 is composed of a constant current-generating unit 1, latches 20A, 20B, 20C, 20D, 20E, 20F, P-type MOS transistors 30, 31, 32, 33, 34, 35, fuses (Fus) 40, 41, 42, 43, 44, 45, transfer gates (TGs) 50, 51, 52, 53, 54, 55 and an inverter 60. Although a single fuse block corresponding to a single memory cell array is shown in FIG. 1, the plural fuse blocks are provided in accordance with the number of the memory cell arrays in the actual semiconductor memory device. Moreover, the memory cell array is omitted in FIG. 1.

The constant current-generating unit 10 is composed of an inverter 11 for inverting a reset signal Sr, a N-type MOS transistor 12 operating in accordance with an output signal of the inverter 11, a P-type MOS transistor 13 inserted between the N-type MOS transistor 12 and a power supply VDD, a P-type MOS transistor 14 inserted between the power supply VDD and a gate of the P-type MOS transistor 13, and a resistor 15 connected with a source of the N-type MOS transistor 12 and the ground GND. The gate of the P-type MOS transistor 13 is connected with the drain of the N-type MOS transistor 12.

Since structures of the latches 20A to 20F are the same, only the structure of the latch 20 A will be explained here, and explanations on those of the other latches will be omitted. The latch 20A is composed of a transfer gate 21 and inverters 22, 23. In the transfer gate 21, the inverter 22 is inserted between a terminal A and an output terminal of FOS, an inverter 23 is inserted between a terminal B and the output terminal of FOS, a terminal C is connected with a terminal 70, and a terminal C bar is connected with an output terminal of the inverter 60 and a terminal C of the transfer gate 50. The fuse information FOS is outputted from the latch 20A. Fuse disconnection informations F01 to F05 for specifying addresses of defective memory cells in the main memory cell array are respectively outputted from the latches 20B to 20F. In the transfer gate 50, a terminal C bar is connected with the terminal 70, a terminal A is connected with a terminal of the fuse 40 on the side of a high potential, and a terminal B is connected with an input terminal of the inverter 23. The fuse 40 is provided to generate the fuse information FOS for deciding whether the redundant circuit is used or not.

Gates of the P-type MOS transistors 30 to 35 are connected with an output terminal (a FC signal-output terminal) of the constant current-generating unit 10, sources of the same are respectively connected with the power supply VDD, and drains of the same are respectively connected with the fuses 40 to 45. The other terminals of the fuses 40 to 45 commonly connected with the ground GND.

FIG. 2 explains operations of important structural elements shown in FIG. 1. FIG. 3 explains an operation of the constant current-generating unit 10. An operation of the semiconductor memory device shown in FIG. 1 will be explained referring to FIGS. 1, 2, and 3.

In an ordinary state, the high logical level is applied to the terminal 70. Accordingly, the low logical level is applied to the N-type MOS transistor 12 via the inverter 11 in the constant current-generating unit 10. Then, the N-type MOS transistor 12 turns off, and the P-type MOS transistor 14 turns on. Since the P-type MOS transistor 14 turns on, a terminal 71 is precharged by the power supply VDD, and the P-type MOS transistor 13 turns off. Accordingly, the P-type MOS transistor 30 to 35 turn off, and a current flows through none of the fuses 40 to 45, and terminal voltages of the fuses 40 to 45 which are respectively denoted by FMS, FM1 to FM5 are at uncertain levels.

At this time, in each of the transfer gates 50 to 55, since the low logical level is applied to the terminal C via the inverter 60 and the high logical level is applied to the terminal C bar from the terminal 70, each of the transfer gates 50 to 55 turns off. On the other hand, in the transfer gate 21 of each of the latches 20 A to 20F, since the high logical level is applied to the terminal C from the terminal 70 and the low logical level is applied to the terminal C bar via the inverter 60, the transfer gate 21 turns on.

Next, a case that a reset signal Sr is inputted to the terminal 70 when the memory is initialized will be explained. The reset signal Sr changes into the low logical level in one-shot.

Since the reset signal Sr inputted to the terminal 70 is inverted by the inverter 11 in the constant current-generating unit 10 and inputted to the gate of the N-type MOS transistor 12, the N-type MOS transistor 12 and the P-type MOS transistor 13 turn on, and the P-type MOS transistor 14 turns off. As a result, a voltage at a certain level is impressed upon the terminal 71 as the FC signal, and the P-type MOS transistors 30 to 35 turn on simultaneously, since the fuses 40 to 45 are respectively connected with the P-type MOS transistors 30 to 35, a fuse current flow in case that the fuse is connected and does not flow in case that the fuse is disconnected. A voltage is generated between the terminals of the fuse 40, 41, . . . , or 45 in case that the fuse current does not flow. That is to say, whether the fuse is disconnected or not can be discriminated on the basis of the terminal voltage of the fuse as shown in FIG. 2.

At this time, in each of the transfer gates 50 to 55, the reset signal Sr at the low logical level is applied to the terminal C bar, and the high logical level, which is derived by inverting the reset signal Sr by the inverter 60, is applied to the terminal C. Accordingly, each of the transfer gates 50 to 55 turns on, and an input signal supplied to the terminal A is transmitted to the terminal B straightly. For instance, if the fuse 40 is disconnected since the terminal voltage FMS of the fuse 40 is at the high logical level, the voltage impressed upon the terminal A of the transfer gate 50 (the high logical level) is transmitted to the terminal B of the transfer gate 50, and inverted by the inverter 23, hence a voltage at the low logical level is outputted as FOS. Moreover, if the fuse 40 is connected a voltage at the low logical level is generated at the terminal of the fuse 40 on the side of VDD as FMS. This signal is outputted to the terminal B of the transfer gate 50, and inverted by the inverter 23 to change into the high logical level. Similarly, the transfer gates 51 to 55 connected with the fuses 41 to 45 respectively turn on, and the signals F01 to F05 (the address informations of the defective cells) are respectively generated in accordance with the disconnections of the fuses.

If the reset signal Sr is at the low logical level and the output of the inverter 23 (FOS) is at the low logical level, the fuse 40 is disconnected. In this case, the output of the inverter is inverted by the inverter 22, and inputted to the terminal A of the transfer gate 21. At this time, the output of the inverter 60 is at the high logical level, and inputted to the terminal C bar. Moreover, since the reset signal Sr is at the low logical level, the transfer gate 21 turns off.

However, if the reset signal Sr at the terminal 70 changes into the high logical level, since the high logical level is applied to the terminal C of the transfer gate 21 and the low logical level is applied to the terminal C bar of the transfer gate 21, the signal supplied from the inverter 22 (the high logical level) passes through the transfer gate 21. The output of the transfer gate 21 is inverted by the inverter 23 to change into the low logical level, and again changes into the high logical level in the inverter 22. Since the signal circulates through a loop represented as the inverter 22, the transfer gate 21, the inverter 23, the inverter 22 and so on, the fuse information is latched by the loop.

However, according to the conventional semiconductor memory device mentioned in the above, since the fuses connected with the P-type MOS transistors in series are situated between the power supply VDD and the ground, the current flowing through the fuses become high, because the resistance of each fuse is nearly the same as that of an ordinary conductive wire. The number of the fuses becomes large as the capacity of the memory device is large, and the total fuse currents become high. Since flip-flops in the semiconductor memory device are initialized collectively when the memory is initialized in most cases, the consumed currents at the time of initialization become high as the capacity of the memory is large.

The semiconductor memory devices in which the currents flowing through the fuses are reduced are disclosed in Japanese Patent Applications Laid-open Nos. 63-217600,2-161698, and 11-168143. In the semiconductor memory device disclosed in Japanese Patent Application Laid-open No.63-217600, a pulse signal for notifying a fuse information is generated synchronizing with turning-on of a power supply, and a fuse is judged disconnected from "1" level of the fuse information and connected from "0" level of the fuse information, hence a fuse current is reduced. In the semiconductor memory device disclosed in Japanese Patent Applications Laid-open No. 2-161698, the fuses are provided for the redundant circuits, and the thereby the currents do not flow through the fuses. In the semiconductor memory device disclosed in Japanese Patent Laid-open No.11-168143, the first fuse is disconnected in case that the redundant circuit is not used, and the second fuse is disconnected in case that the redundant circuit is used, hence the fuses currents are reduced.

However, in the semiconductor memory device disclosed in Japanese Patent Application Laid-open No.63-217600, it is necessary to provide a power supply-initializing circuit for generating a fuse signal. In the semiconductor memory device disclosed in Japanese Patent Application Laid-open No.2-161698, it is necessary to provide a redundant address-setting circuit in addition to a fuse circuit, and the fuses are provided for the redundant address-setting circuit. In the semiconductor memory device disclosed in Japanese patent Applications Laid-open No.11-168143, plural fuses are used in order to obtain a single fuse information. As mentioned in the above, the methods used in the aforementioned conventional semiconductor memory devices cannot be applied to the circuit structure shown in FIG. 1 in order to reduce the fuse currents.

SUMMARY OF THE INVENTION

Accordingly, it is an object of the invention to provide a semiconductor memory device in which peripheral circuits of fuses of an unused redundant circuit are not initialized and consumed currents are reduced in case that the peripheral circuits of fuses are initialized.

According to the feature of the invention, a semiconductor memory device comprises a main memory, redundant memory cell arrays, and redundant circuits, each of which replaces a defective memory cell with the redundant memory cell array and assigns an address of the defective memory cell on a basis of disconnections of plural fuses when a defective part occurs in the main memory, wherein each of the redundant circuits comprises:

a fuse block which assigns the address of the defective memory cell by selectively disconnecting the plural fuses, plural address-generating latches which individually generate and hold fuse informations, each being represented as a binary data, depending on whether a current flows through at least one of the plural fuses or not, when the main memory is initialized, a redundant circuit-selecting latches which is provided with a redundant circuit-selecting fuse to be disconnected in case that the redundant circuit is used, generates and holds a fuse information represented as binary data depending on whether a current flows through a redundant circuit-selecting fuse or not, when the main memory is initialized, and generates a signal for notifying disconnection of a fuse in case that the redundant circuit-selecting fuse is disconnected, and a semiconductor switch which forms a returning path of the current flowing through the at least one of the plural fuses responding to the signal for notifying the disconnection of the redundant circuit-selecting fuse.

According to the aforementioned structure, if the redundant circuit-selecting fuse is disconnected, the redundant circuit-selecting latch outputs a signal notifying that the redundant circuit-selecting fuse is disconnected to the semiconductor switch. When the signal notifying the disconnection of the redundant circuit-selecting fuse is inputted to the semiconductor switch the semiconductor switch connects all the fuses in the plural address-generating latches with the ground so that the returning paths of the fuse currents are formed. At this time, the plural address-generating latches generated and hold the different fuse informations depending on whether the fuses are disconnected or connected. The fuses in the address-generating latches are supplied with the currents only in case that the redundant circuit-selecting fuse belonging to the same group is disconnected in other words the redundant circuit is used, and the currents do not flow through the fuses of the unused redundant circuit. Accordingly, in the above mentioned structure in which information on disconnections of the fuses is judged and latched on the basis of the fuse currents at the time of initialization, the fuse currents at the time of initialization can be reduced.

BRIEF DESCRIPTION OF THE DRAWINGS

The invention will be explained in more detail in conjunction with the appended drawings, wherein.

DESCRIPTION OF THE PREFERRED EMBODIMENTS

Hereinafter, preferred embodiments of the invention will be explained referring to the appended drawings.

Figure 4:
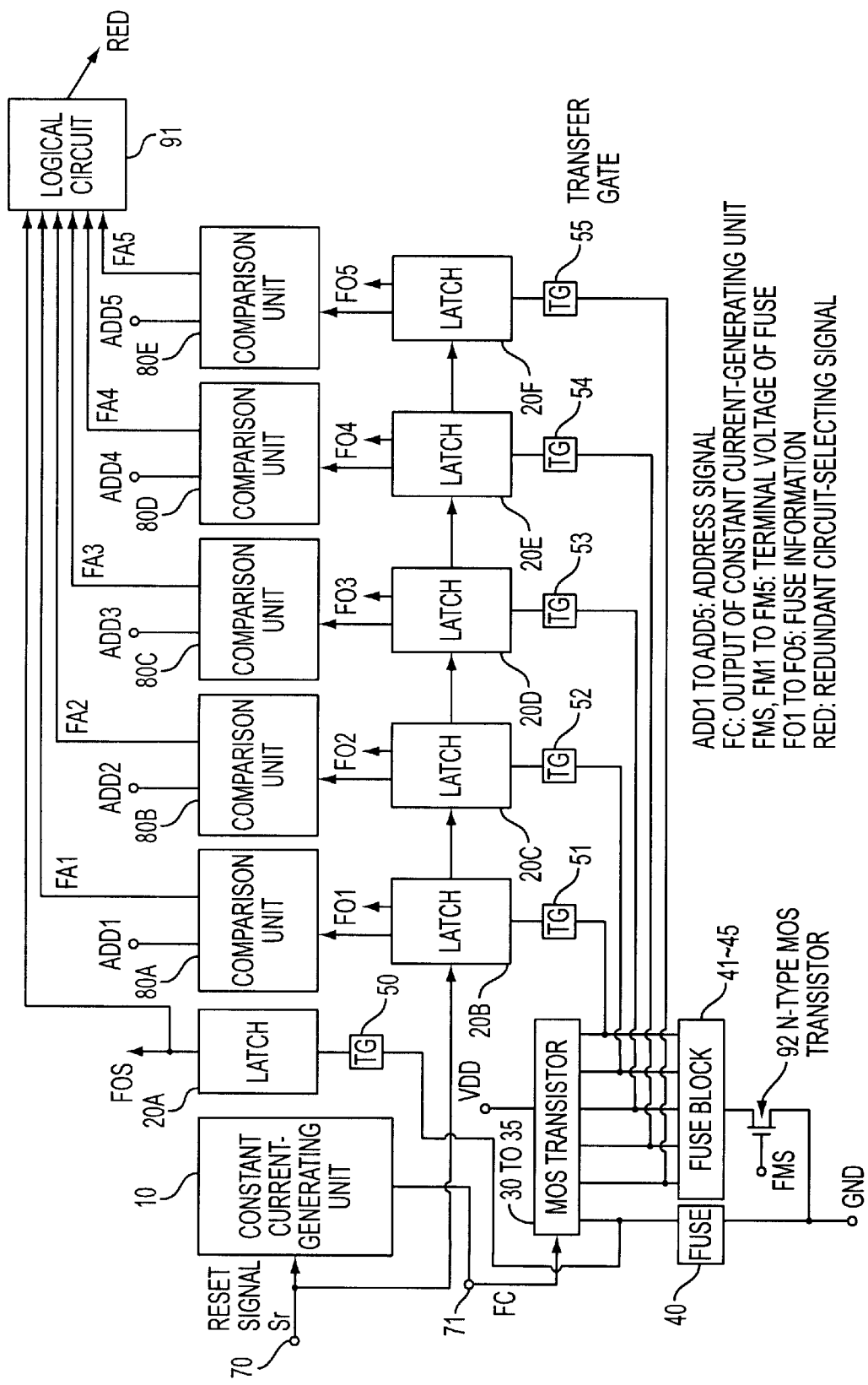
FIG. 4 shows a block diagram for showing a structure of a semiconductor memory device according to the invention.
Figure 5:
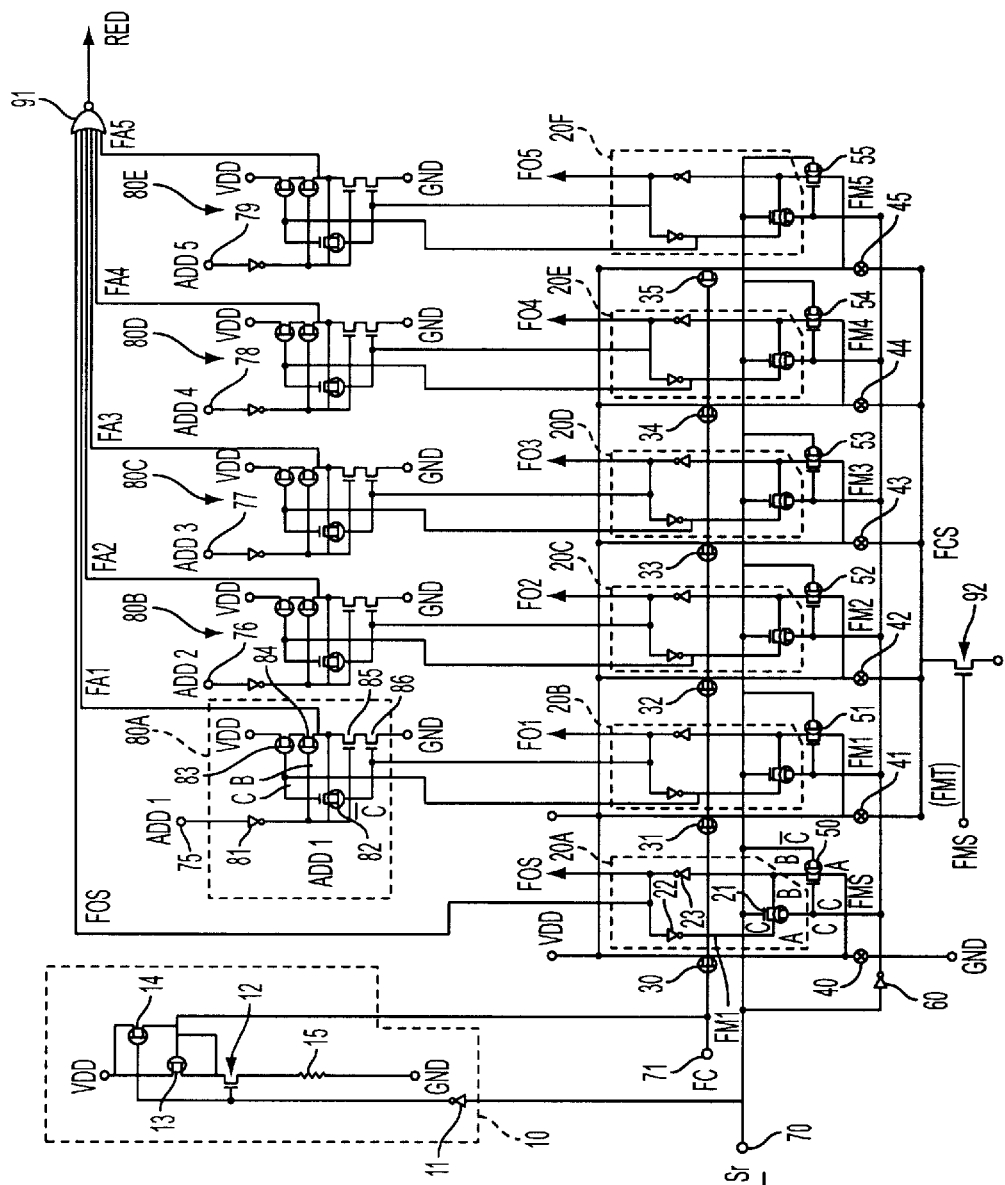
FIG. 5 shows a circuit diagram for showing a detailed structure of a semiconductor memory device according to the invention.

FIG. 4 shows a semiconductor memory device according to the invention, and FIG. 5 shows a detailed structure of the semiconductor memory device according to the invention. The semiconductor memory device is composed of a main memory cell array, redundant memory cell arrays, and redundant circuits, and only a single redundant circuit is shown in FIGS. 4 and 5. If a defect, occurs in a part of the main memory cell array, the defective memory cell array is replaced with the redundant memory cell array. In this case, an address of the defective memory cell is assigned by selectively disconnecting plural fuses. Although a single redundant circuit is shown in FIGS. 4 and 5, the number of the redundant circuits is the same as that of the redundant memory cell arrays. Since the structural elements with the same functions are denoted by the same reference numerals throughout FIGS. 1, 4, and 5, duplicated explanations will be omitted.

Figure 1:
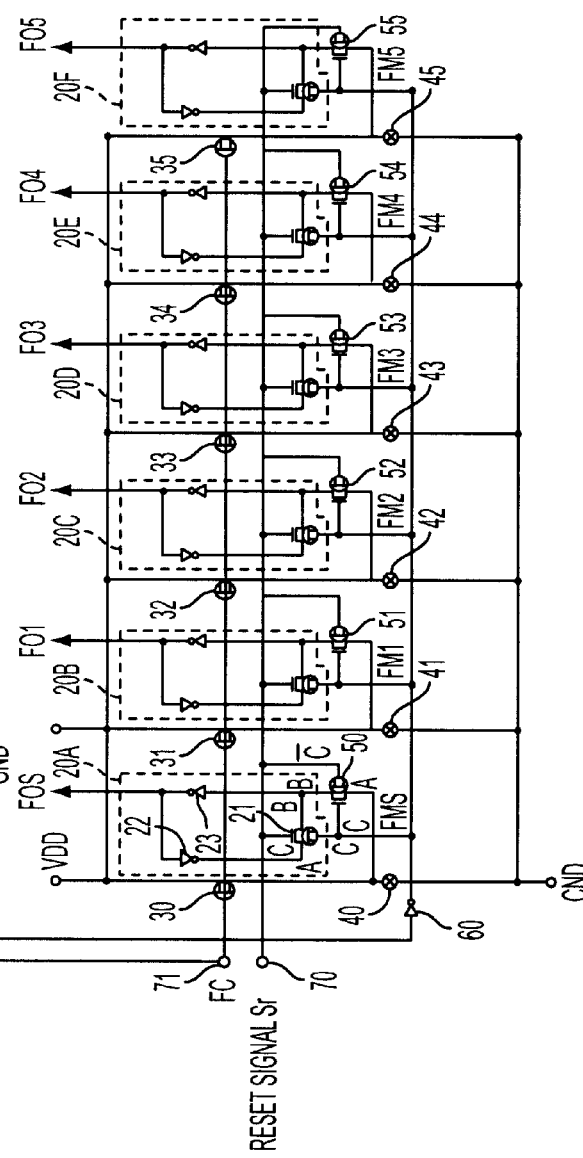
FIG. 1 shows a circuit diagram for showing a conventional semiconductor memory device.

As shown in FIG. 4, the semiconductor memory device is composed of comparison units 80A, 80B, 80C, 80D, 80E, 80F, a logical circuit 91 and a N-type MOS transistor 92 in addition to the constant current-generating circuit 10, the latches 20A, 20B to 20 F, the P-type MOS transistors 30,31 to 35, the fuses (FUs) 40,41, to 45, the transfer gates (TGs) 50,51 to 55, and the inverter 60, which are respectively shown in FIG. 1. The aforementioned comparison unit makes a comparison between an address signal and a fuse information as mentioned later. The fuses 41 to 45 constitute a fuse block.

Figure 2:
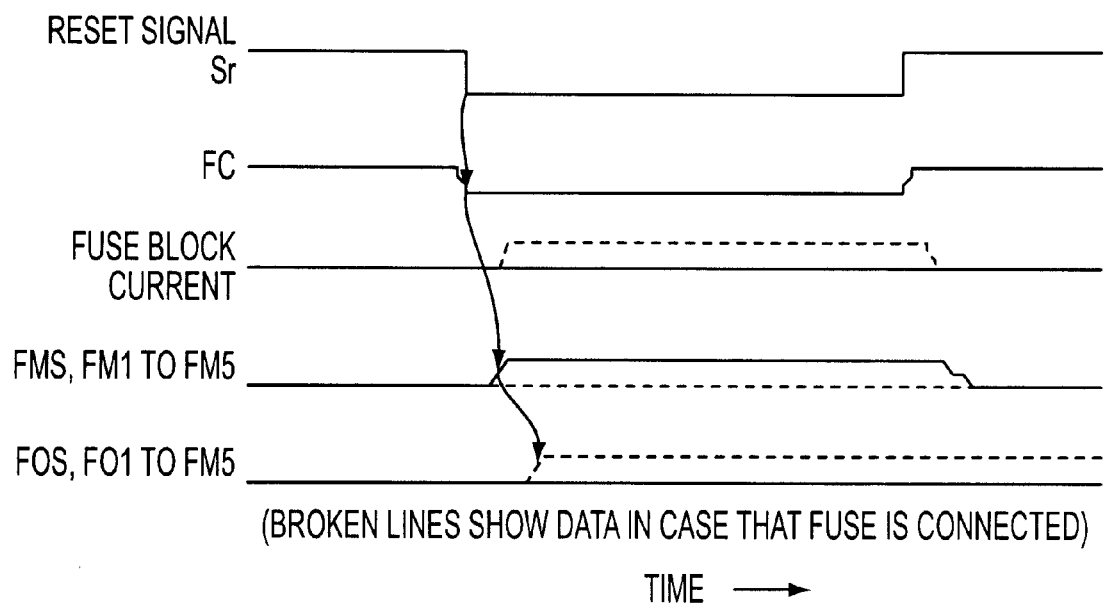
FIG. 2 shows a timing chart for explaining an operation of a semiconductor memory device shown in FIG. 1.
Figure 3:
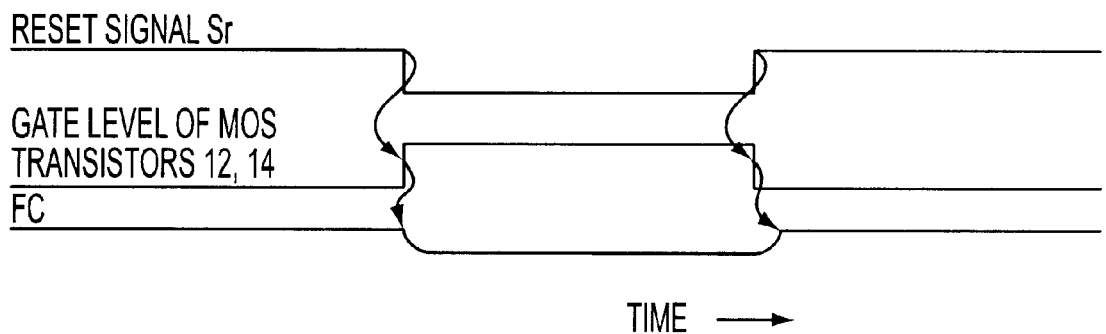
FIG. 3 shows a timing chart for explaining an operation of a constant current-generating unit of a semiconductor memory device shown in FIG. 1.

The structure and the operation of the constant current-generating unit 10 have be already explained referring to FIGS. 1 to 3. Moreover, the latches 20A to 20F and peripheral circuits thereof have been already explained referring to FIG. 1 also. A NOR gate 91 is used as the logical circuit. The comparison units 80A to 80E supply output signals FA1 to FA5 to the logical circuit (the NOR gate) 91, and NOR logic is met therein. The logical circuit 91 outputs a signal at the high logical level in case that all the output signals FOS, FA1 to FA5 are at the low logical level, and outputs a signal at the low logical level in case that at least one of the output signals FOS, FA1 to FA5 is at the high logical level.

Since all the comparison units 80A to 80E have the same structure, only an operation of the comparison unit 80A will be explained. As shown in FIG. 5, the comparison unit 80A is composed of an inverter 81, a transfer gate 82, P-type MOS transistors 83,84 and N-type MOS transistors 85,86. The inverter 81 is connected with an input terminal 75. The P-type MOS transistors 83, 84 and the N-type MOS transistors 85,86 are connected in series, and a series connection of these transistors is inserted between a power supply VDD and the ground GND.

A gate of the P-type MOS transistor 83 is connected with an output terminal of an inverter 22 in the latch 20B. Gates of the P-type MOS transistor 84 and the N-type MOS transistor 85 are connected with an output terminal of the inverter 81. A gate of the N-type MOS transistor 86 is connected with an output terminal of an inverter 23 in the latch 20B. The P-type MOS transistor 83 and the N-type MOS transistor 86 constitute a CMOS inverter. Similarly, the P-type MOS transistor 84 and the N-type MOS transistor 85 constitute a CMOS inverter. In the transfer gate 82, a terminal A is connected with the output terminal of the inverter 81, a terminal B is connected with a connection point of the MOS transistor 84 and 85, a terminal C bar is connected with a gate of the N-type MOS transistor 86, and a terminal C is connected with the gate of the P-type MOS transistor 83. Moreover, a terminal of the fuse 40 on the side of the ground GND is separated from those of the fuses 41 to 45. Terminals of the fuses 41 to 45 on the side of a low potential are commonly connected with a drain of the N-type MOS transistor 92. A source of the N-type MOS transistor 92 is connected with the ground terminal GND, and a FMS or FMT signal is impressed upon a gate of the N-type MOS transistor 92.

Next, operations of the strutures shown in FIGS. 4 and 5 will be explained.

The operation of the whole structure will be explained in the first place. Fuse disconnection informations F01 to F05 supplied from the latches 20 B to 20 F are respectively compared with the address signals ADD 1 to ADD5 inputted from the outside. The logical circuit 91 outputs a redundant circuit-selecting signal RED for deciding whether the redundant circuit for relieving a defective memory cell array is used or not on the basis of the output signals FA1 to FA5 respectively generated by the comparison units 80A to 80E as results of the comparisons.

The redundant circuit-selecting signal RED turns to the high logical level when all the following conditions are satisfied, and the redundant memory cell array is used.

(a) The fuse 40 is disconnected, and FOS is at the low logical level. (The fuse 40 is disconnected certainly in case that the redundant circuit is used.)

(b) The address signals ADD1 to ADD5 coincide with the fuse informations F01 to F05 respectively. That is to say, FA1 to FA5 are at the low logical level. The operations of the comparisons in (b) are performed in the comparison units 80 A to 80E.

Figure 6:
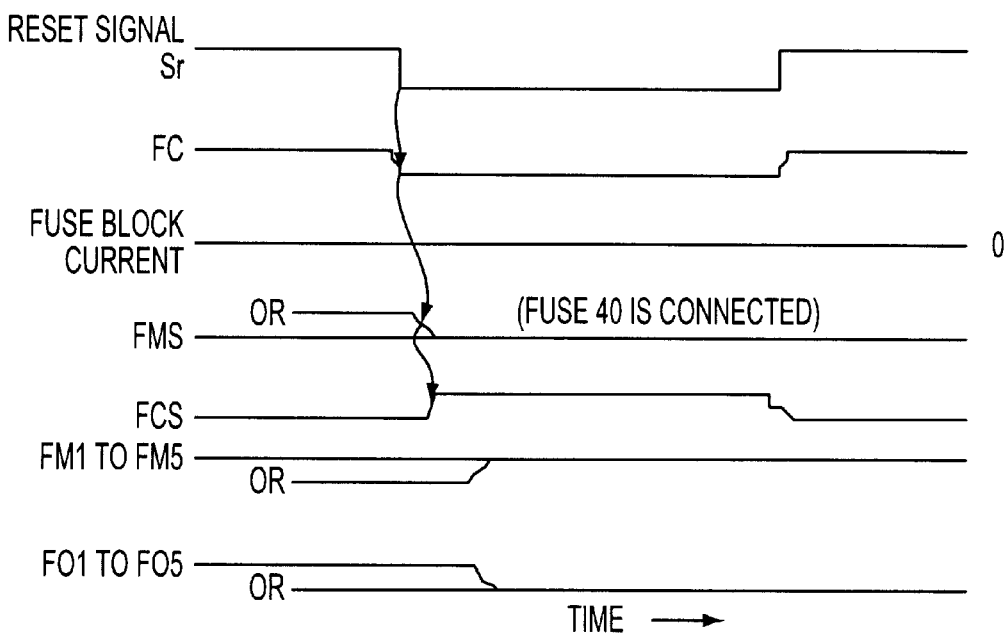
FIG. 6 shows a timing chart for explaining an operation of a semiconductor memory device according to an embodiment shown in FIG. 5 in case that a redundant circuit is not used.
Figure 7:
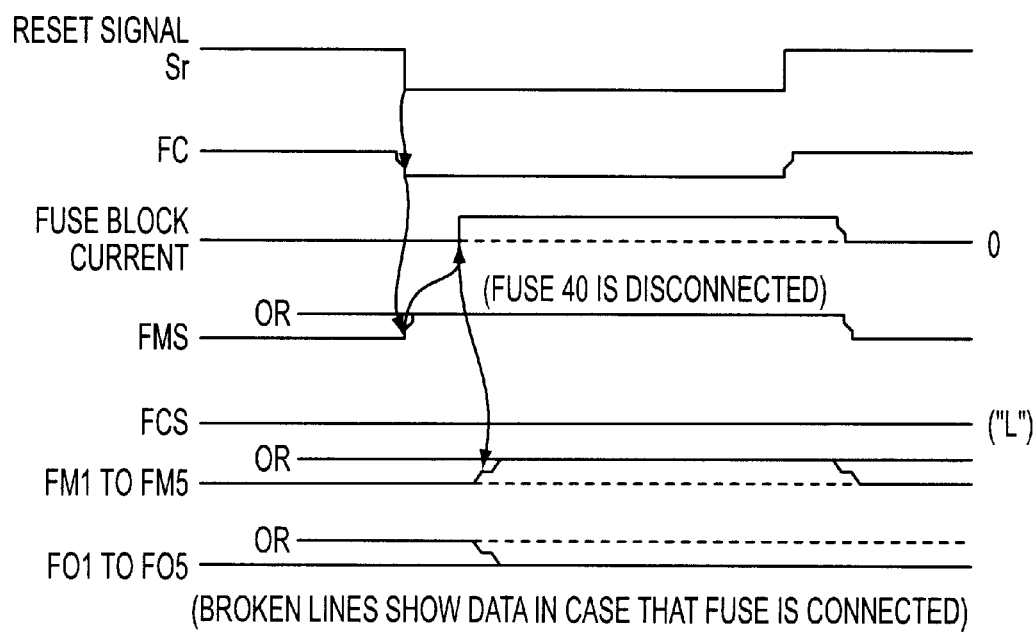
FIG. 7 shows a timing chart for explaining an operation of a semiconductor memory device according to an embodiment shown in FIG. 5 in case that a redundant circuit is used.

FIG. 6 shows the operation of the embodiment shown in FIG. 5 in case that the redundant circuit is not used, and FIG. 7 shows the same in case that the redundant circuit is used. The operations of the comparison unit 80A and the latch 20 B will be explained mainly referring to FIGS. 6 and 7.

The operation of the embodiment will be explained in case that the embodiment operates ordinarily and the redundant circuit is not used (the fuse 40 is connected) referring to FIG. 6 in the first place. In this state, the high logical level is applied to the terminal 70, and the output FC of the constant current-generating unit 10 is precharged by the power supply VDD, and the P-type MOS transistors 30 to 35 turn off. The transfer gate 50 turns off also, and the fuse information FOS is not generated. At this time, since the fuse 40 is connected, the terminal voltage FMS at the low logical level is generated, the N-type MOS transistor 92 turns off, and all the fuses 41 to 45 are separated from the ground terminal GND.

Next, if a reset signal Sr (the low logical level) is impressed upon the terminal 70, since the output FC of the constant current-generating unit 10 turns to the low logical level, the P-type MOS transistors 30 to 35 turn on, the transfer gate 50 turns on, the transfer gate 21 turns off, and the N-type MOS transistor 92 turns off. Moreover, the terminal voltage FMS of the fuse 40 is at the low logical level, the output of the transfer gate 50 is at the low logical level, and the output of the inverter 23 is at the high logical level. On the other hand, since the N-type MOS transistor 92 turns off, the currents do not flow through the fuses 41 to 45 independently of whether fuses 41 to 45 are disconnected or not, and the voltages at the high logical level are outputted from the transfer gates 51 to 55. All these voltages are respectively inverted by the inverter 23 in the latches 20 B to 20F, and turn to the low logical level. That is to say., the fuse informations at the low logical level F01 to F05 are respectively outputted from the latches 20B to 20F.

As seen from FIG. 6, the N-type MOS transistor 92 operates in connection with the condition of the fuse 40, and, in case that the N-type MOS transistor 92 turns off, the current flows through none of the fuses connected with the N-type MOS transistor 92. As a result, the currents do not flow through the fuses provided for the unused redundant memories, and kthe consumed current at the time of initialization can be reduced.

Next, the operation of the embodiment will be explained in case that the redundant circuit is not used (the fuse 40 is disconnected).

Next, if the reset signal Sr (the low logical level) is impressed upon the terminal 70, since the output FC of the constant current-generating unit 10 turns to the low logical level, the P-type MOS transistors 30 to 35 turn on, the transfer gate 50 turns on, and the transfer gate 21 turns off. Moreover, since the fuse 40 is disconnected the terminal voltage of the fuse 40 (FMS) is at the high logical level, and the N-type MOS transistor 92 turns on. Then, the output of the transfer gate 50 is at the high logical level, and the output of the inverter 23, in other words FOS, is at the low logical level. On the other hand, since the N-type MOS transistor 92 turns on, the currents flow continuously through the fuses 41 to 45 when they are connected, and not flow when they are disconnected. Accordingly, when the fuses 41 to 45 are connected, FM1 to FM5 are at the low logical level, and fuse informations F01 to F05 are at the high logical level. When the fuses 41 to 45 are disconnected, FM1 to FM5 are at the high logical level, and fuse informations F01 to F05 are at the low logical level. For example, when the fuse 41 is disconnected the terminal voltage FM1 of the fuse 41 is at the high logical level, the output of the transfer gate 51 is at the high logical level, and the fuse information F01 outputted from the latch 20B is at the low logical level.

In case that the fuse 41 is disconnected, since the terminal voltage FM1 is at the high logical level (at the time of initialization) and fuse information F01 is at the low logical level, the high logical level is applied to the terminal C of the transfer gate 82 and the low logical level is applied to the terminal C bar of the same, hence the transfer gate 82 turns on. Moreover, since the output of the inverter 22 of the latch 20B (the high logical level) is inputted to the gate of the P-type MOS transistor 83, the P-type MOS transistor 83 turns off. Since the output of the inverter 81 (the low logical level) is inputted to the gate of the P-type. MOS transistor 84, the P-type MOS transistor 84 turns on. Since the low logical level is applied to the gates of the N-type MOS transistors 85,86,both the N-type MOS transistors 85,86 turn off. Although the P-type MOS transistor 84 turns on, since the P-type MOS transistor 83 turns off, there is no continuity between the power supply VDD and the ground GND, and no CMOS inverter is constituted. As a result, the signal address ADD1 is inverted by the inverter 81, and the signal ADD1 bar passes through the transfer gate 82 and is outputted as FA1.

On the other hand, when the fuse 41 is connected, since fuse information F01 is at the high logical level and the transistors 83,86 turn on, the P-type MOS transistor 84 and the N-type MOS transistor 85 constitute the inverter circuit by the output of the inverter 81, and the signal which is derived by inverting the output of the inverter 81, in other words the address signal ADD1, is outputted as FA1. As mentioned in the above, in case that the fuse 41 is disconnected, the signal which is derived by inserting the address signal ADD1 (the low logical level) is outputted as FA1 and in case that the fuse is connected, the address signal ADD1 (the high logical level) is outputted as FA1.

Although the explanations are given on the relation between fuse information F01 of the fuse 41 and the address signal ADD1, the similar relations exist between fuse informations F02 to F05 and the address signals ADD2 to ADD5. As shown in FIG. 7, fuse information F01 to F05 are generated immediately after the reset signal Sr (the low logical level) is impressed upon the terminal 70, and held by the latches 20 B to 20F. The address signals ADD1 to ADD5 are respectively compared with fuse information F01 to F05 inputted from the latches 20B to 20F by the comparison units 80A to 80E under a condition of one to one correspondence. The output signals FA1 to FA5 derived in this way are inputted to the logical circuit 91 (the NOR gate), which outputs the redundant circuit-selecting signal RED at the high logical level in case that all the six input signals are at the low logical level.

In case that FOS is not inputted to the logical circuit 91, if all the fuses 41 to 45 are connected and all the address signals ADD1 to ADD5 are at the low logical level, the redundant circuit-selecting signal RED is outputted independently of whether the redundant circuit is used or not. Similarly, in the aforementioned case, if all the fuses 41 to 45 are disconnected and all the address signals ADD1 to ADD5 are at the high logical level, the redundant circuit-selecting signal RED is outputted independently of whether the redundant circuit is used or not. In order to prevent the aforementioned situation from occurring, FOS is inputted to the logical circuit 91.

As the other embodiment of the invention, the semiconductor memory device can be so constructed that the initialization of the peripheral circuit of the fuse for deciding whether the redundant circuit is used or not is performed preceding the initializations of the peripheral circuits of the fuses for clarifying the address informations of the defective memory cells. According to the aforementioned structure, the consumed current in the unused part of the redundant circuit can be cut off perfectly.

As mentioned in the above, according to the semiconductor memory device according to the invention, since the fuses in the fuse block are supplied with the currents only when the redundant circuit is used and the currents do not flow through the fuses provided for the unused redundant memory cell array, the current flowing through fuses at the time of initializations of the peripheral circuits of the fuses for clarifying the address informations of the defective memory cell arrays can be reduced.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A semiconductor memory device, comprising a main memory; redundant memory cell arrays each for replacing a defective memory cell of said main memory; and redundant circuits each for replacement of said defective memory cell with said redundant memory cell array and for holding and generating an address of said defective memory cell;

wherein said each of said redundant circuits, comprises:
   a fuse block including plural fuses which are selectively disconnected in accordance with said address of said defective memory cell;
   a redundant memory cell-selecting fuse which is disconnected when said redundant circuit is selected for use of said redundant memory cell array;
   plural latches for holding information on a state when said plural fuses are selectively disconnected in said fuse block during a time of power initialization;
   a redundant circuit-selecting latch for holding information as to whether said redundant memory cell-selecting fuse is disconnected or not; and
   a semiconductor switch to be turned on when said redundant memory cell-selecting fuse is disconnected, and to be turned off when said redundant memory cell-selecting fuse is not disconnected, whereby power consumption is decreased at the time of power initialization not to pass a current through said fuse block.

2. The semiconductor memory device as defined in claim 1, wherein:
   said plural fuses in said fuse block are equal in number to bits of an address signal, and are selectively disconnected in accordance with levels of said address signal.

3. The semiconductor memory device as defined in claim 1, wherein:
   each of said plural latches comprises:
   a transfer gate which is supplied with a reset signal and an inverted signal of said reset signal as gate signals, each being inputted to said transfer gate when said main memory is initialized, and a terminal voltage of one of said plural fuses as an input signal, and
   a latch for holding an output signal of said transfer gate.

4. The semiconductor memory device as defined in claim 1, wherein:
   said redundant circuit-selecting latch comprises:
   a transfer gate which is supplied with a reset signal and an inverted signal of said reset signal as gate signals, each being inputted to said transfer gate, when said main memory is initialized, and a terminal voltage of said redundant memory cell-selecting fuse as an input signal, and
   a latch for holding an output signal of said transfer gate.

5. The semiconductor memory device as defined in claim 1, wherein:
   each of said plural latches is connected with a comparison unit which compares fuse information generated by one of said plural fuses with an address signal inputted from an outside.

6. The semiconductor memory device as defined in claim 1, wherein:
   said information of said plural latches and said redundant circuit-selecting latch is inputted to a logical circuit, which generates a redundant circuit-selecting signal in case that all input signals are at a same logical level.

7. The semiconductor memory device as defined in claim 2, wherein:
   one bit of an address signal of said defective memory cell is specified by one fuse of said plural fuses in said fuse block, said plural fuses being selectively disconnected in accordance with levels of said address signal.

8. The semiconductor memory device as defined in claim 2, wherein:
   each of said plural latches comprises:
   a transfer gate which is supplied with a reset signal and an inverted signal of said reset signal as gate signals, each being inputted to said transfer gate when said main memory is initialized, and a terminal voltage of one of said plural fuses as an input signal, and
   a latch for holding an output signal of said transfer gate.

9. The semiconductor memory device as defined in claim 2, wherein:
   said redundant circuit-selecting latch comprises:
   a transfer gate which is supplied with a reset signal and an inverted signal of said reset signal as gate signals, each being inputted to said transfer gate, when said main memory is initialized, and a terminal voltage of said redundant memory cell-selecting fuse as an input signal, and
   a latch for holding an output signal of said transfer gate.

10. The semiconductor memory device as defined in claim 2, wherein:
    each of said plural latches is connected with a comparison unit which compares fuse information generated by one of said plural fuses with an address signal inputted from an outside and outputs a fuse-address signal when a fact that said one of said plural fuses is disconnected is confirmed on a basis of said address signal.

11. The semiconductor memory device as defined in claim 2, wherein:

said information of said plural latches and said redundant circuit-selecting latch is inputted to a logical circuit, which generates a redundant circuit-selecting signal in case that all input signals are at a same logical level.

* * * * *